United States Patent
Overton et al.

(10) Patent No.: US 9,236,209 B2
(45) Date of Patent: Jan. 12, 2016

(54) RELAY FAILURE DETECTION SYSTEM

(71) Applicant: Tektronix, Inc., Beaverton, OR (US)

(72) Inventors: Michael S. Overton, Beaverton, OR (US); Robert Davies, Portland, OR (US); Thomas Chabreck, Tigard, OR (US)

(73) Assignee: TEKTRONIX, INC., Beaverton, OR (US)

( * ) Notice: Subject to any disclaimer, the term of this patent is extended or adjusted under 35 U.S.C. 154(b) by 7 days.

(21) Appl. No.: 14/242,673

(22) Filed: Apr. 1, 2014

(65) Prior Publication Data

US 2014/0300481 A1 Oct. 9, 2014

Related U.S. Application Data

(60) Provisional application No. 61/808,129, filed on Apr. 3, 2013.

(51) Int. Cl.
*G08B 21/00* (2006.01)
*H01H 47/00* (2006.01)
*G08B 21/18* (2006.01)
*G01R 31/327* (2006.01)

(52) U.S. Cl.
CPC ......... *H01H 47/002* (2013.01); *G01R 31/3278* (2013.01); *G08B 21/185* (2013.01)

(58) Field of Classification Search
CPC ....... H01H 45/00; H01H 71/04; H01H 83/00; G08B 21/18; G01R 31/3277
USPC ........... 340/644, 635, 657; 361/191, 160, 187
See application file for complete search history.

(56) References Cited

U.S. PATENT DOCUMENTS

| | | | | |
|---|---|---|---|---|
| 3,882,456 A | * | 5/1975 | Takada | 178/69 G |
| 5,590,013 A | * | 12/1996 | Harasawa | 361/187 |
| 5,859,590 A | * | 1/1999 | Otani | 340/635 |
| 6,304,189 B1 | * | 10/2001 | Koch et al. | 340/664 |
| 2014/0070953 A1 | * | 3/2014 | Chopade et al. | 340/644 |

FOREIGN PATENT DOCUMENTS

| | | |
|---|---|---|
| JP | H09205498 | 8/1997 |
| JP | 2001035335 | 2/2001 |

OTHER PUBLICATIONS

Nadal, Rafael, Extended European Search Report, Jul. 28, 2014, 8 pages, EP Application No. 14163203.4, European Patent Office, Munich, Germany.

* cited by examiner

*Primary Examiner* — Phung Nguyen
(74) *Attorney, Agent, or Firm* — Marger Johnson

(57) ABSTRACT

A relay fault detection and correction system includes a signal detector structured to measure primary and secondary signals, and generates a fault output signal if the signals appear to be unterminated due to a relay not connecting the signals to the loads. A cycle circuit is structured to cause a relay controller to cycle a potentially under-performing relay between its states a number of times after the signal detector generates the fault output.

23 Claims, 4 Drawing Sheets

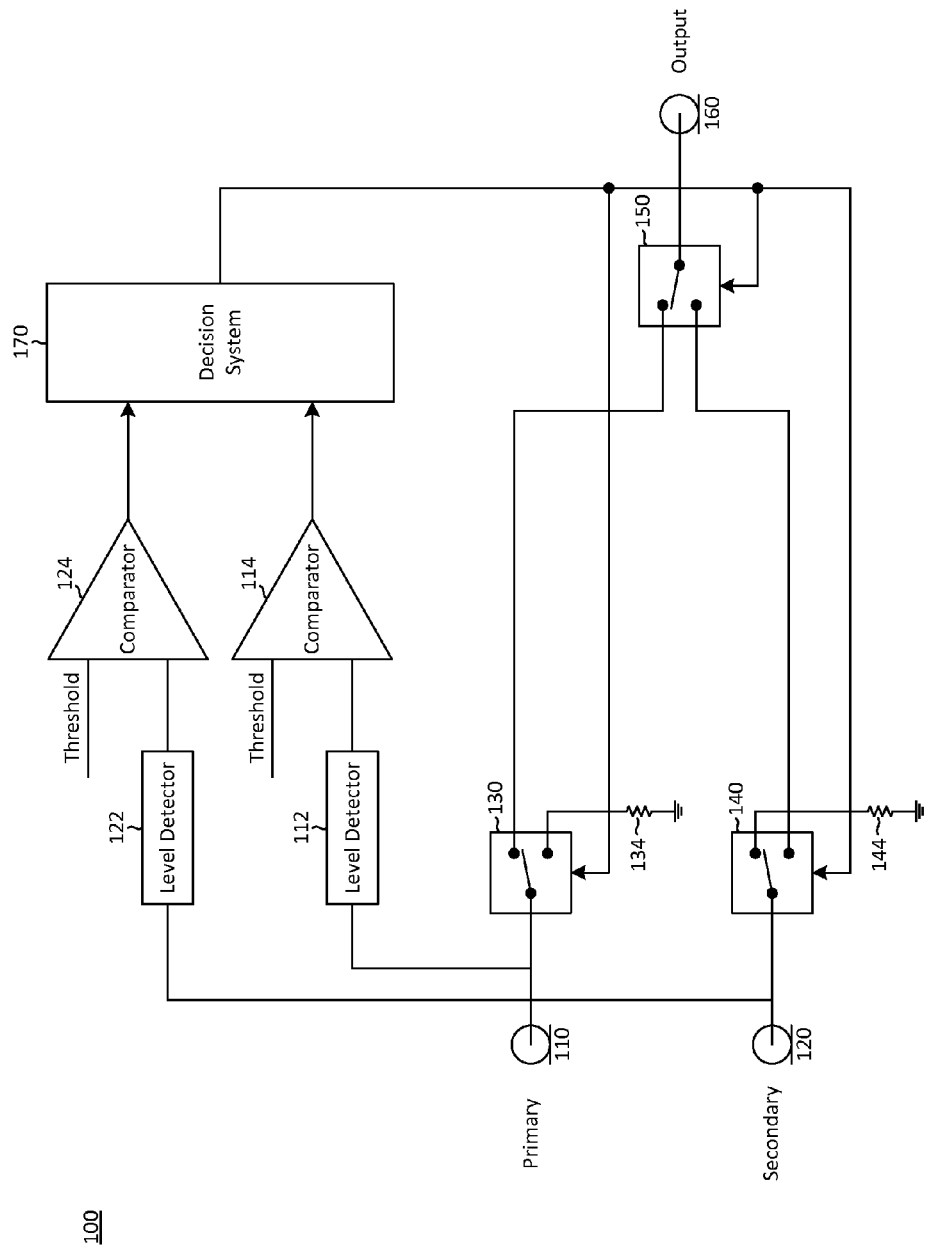
FIG. 1
(Conventional)

RELAY FAILURE DETECTION SYSTEM

CROSS REFERENCE TO RELATED APPLICATIONS

This application claims benefit of U.S. Provisional application 61/808,129, entitled RELAY FAILURE DETECTION VIA SIGNAL LEVEL SENSING, filed on Apr. 3, 2013, the contents of which are all incorporated by reference herein.

FIELD OF THE INVENTION

This disclosure is directed to a failure detection system, and more particularly, to a system that detects a relay failure and generates a response based on the detection.

BACKGROUND

Relays are commonly used to provide switching for signals. If a relay fails with an open circuit, then the system using the signal from the relay will not operate properly because the connection normally closed by the relay remains open. In general this disclosure relates to mechanical relays that continue to pass signal even when power to the relay is removed.

A particular application for such relays include a video device called an Electronic Change Over (ECO) for video signals, such as the ECO422D available from Tektronix, Inc. of Beaverton, Oreg. In an ECO, relays are used to provide backup protection. For instance, a relay or relay network may be connected to two sources of the same video signal, a primary and a backup. In operation, the relay network begins by initially coupling the primary video signal to an output by moving the armatures to the primary state. If the primary input signal should fail, the relays can quickly change to the backup video source with a minimum of delay or interruption by simply changing the states of the relays. Relays are preferred for this application over electronic switches since a relay will continue to pass a signal even if power to the ECO is removed.

The combination of a primary source and a backup source connected to an output makes a channel. In practice ECOs may have ten, twenty or more channels.

It is common that whichever of the primary and secondary signals is not active in the ECO be connected to a load termination, such as a resistor, so that the non-active source is driving a nominal load rather than being connected to an open circuit.

A problem with ECOs exists in that relays have two common failure mechanisms. One failure is that relay contacts wear after a relatively large number of change cycles. This failure is usually not problematic in ECOs since the relays only occasionally or rarely switch to the backup video signal. For instance the ECOs occasionally switch to the backup video signal to test the backup or to allow maintenance on the primary signal delivery system. The second failure mechanism is that the electrical contacts of mechanical relays tend to degrade after a long period without use. This degradation is usually caused by oxidation of the contact material or deposition of organic material on the open contacts of the relay. This second failure mechanism is problematic for ECOs since they may be connected to the primary video input for a very long time, for instance measured in years, before changing to the secondary video input. This long time period may allow degradation of the relay contacts that connect the secondary video input to occur. Having a degraded relay contact may prevent the secondary signal from being able to be switched, or may generate noise or other interference in the secondary video signal.

Embodiments of the invention address these and other issues in the prior art.

SUMMARY OF THE DISCLOSURE

Embodiments of the invention include a relay fault detection system structured to detect relay faults within a switching system. Some embodiments of the relay fault detection system include a first relay coupled to a first signal and a second relay coupled to a second signal. Both the first and second relays are coupled to a system output. A control system is structured to make exactly one of the first or second signals the active output of the switching system. A level detector is coupled to the first signal and coupled to the second signal and is structured to generate a signal level output from the first signal and from the second signal. A low threshold detector is structured to detect a low signal level output as a signal fault and a high threshold detector is structured to detect a high signal level output as a relay fault.

A cycle circuit is structured to cycle any or all of the relays between a first operative state and a second operative state a plurality of times after the high threshold detector generates a relay fault.

Further, a notification unit is structured to generate a notification based on a presence of a relay fault. The notification may be, for example, an entry in an error log, a sound, a light, a text message, or an email.

BRIEF DESCRIPTION OF THE DRAWINGS

FIG. 1 is a block circuit diagram of a conventional switching relay circuit commonly used in ECOs.

DETAILED DESCRIPTION

Figure 2:
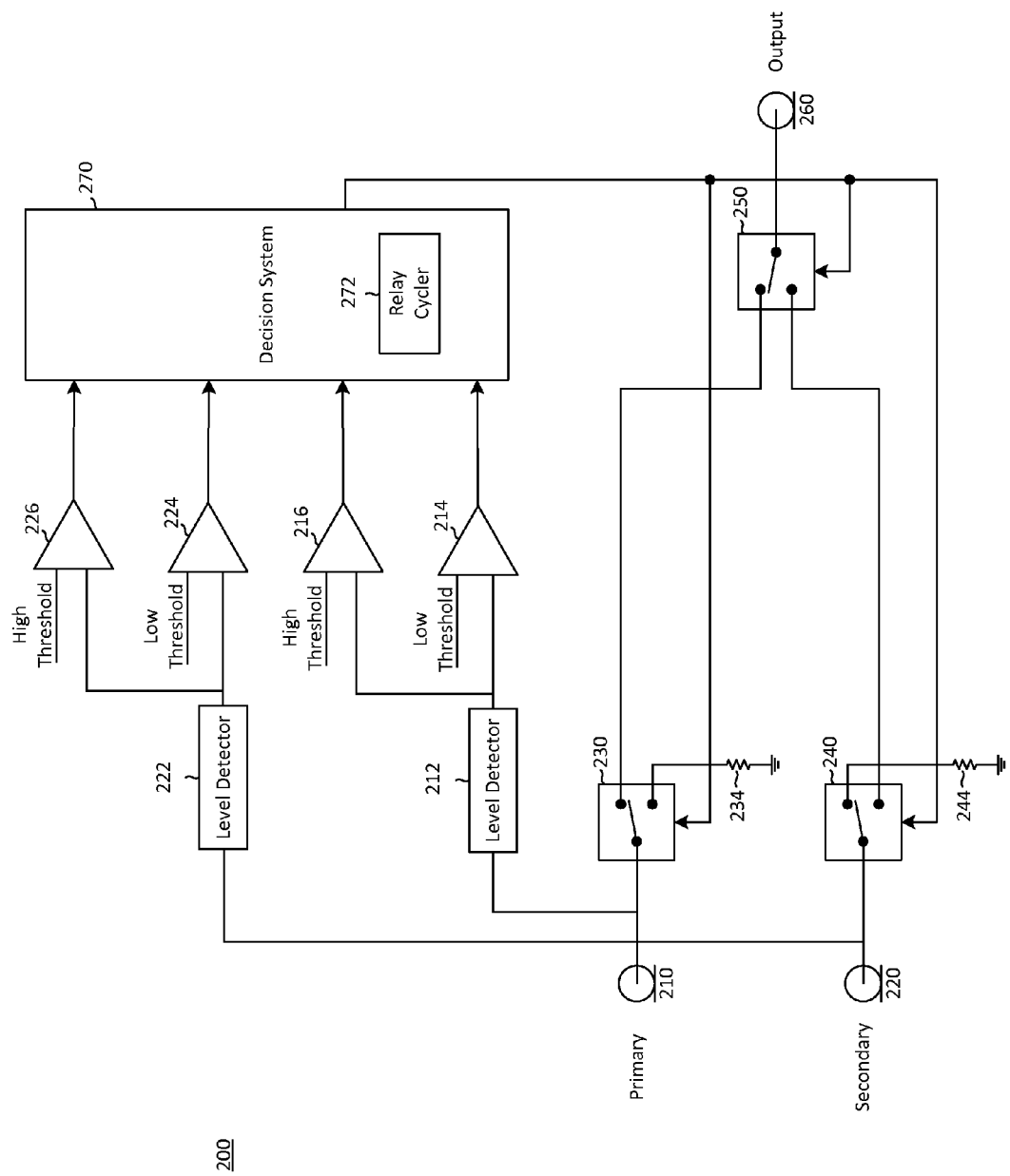
FIG. 2 is a block circuit diagram of an improved relay failure detection system according to embodiments of the invention.

As described herein, embodiments of the invention are directed to a relay failure detection system. Some embodiments additionally include a procedure that may correct a detected relay fault.

FIG. 1 is a block circuit diagram of a conventional switching relay circuit 100 commonly used in ECOs. The switching circuit 100 includes two inputs 110, 120, which are labeled as primary and secondary, respectively. The input labels "Primary" and "Backup" are names of the signals or the sync generator from which they come. One of the primary and backup signals is connected to an output 160 as an active signal, as described below. In FIG. 1, the primary input 110 is connected to a relay 130, while the secondary input is coupled to a relay 140. Both of the relays 130, 140 are coupled to a relay 150. Depending on the state of the relays 130, 140, 150, either the primary signal or backup signal may be the active signal, which is passed through the output of the relay 150 as the output 160 of the switching circuit 100.

The relays 130, 140 each include a single input and two outputs, as seen in FIG. 1. One output of each of the relays 130, 140 is coupled to and becomes a respective input to the relay 150. The other output of each of the relays 130, 140 is coupled to a terminating resistor, labeled 134 and 144, respectively.

A level detector 112 is coupled to the input 110, while a level detector 122 is coupled to the input 120. The level detectors 112, 122 convert the amplitude of the signals to which they are connected into an output, such as an output voltage. In general, a level detector generates a higher output voltage the higher its input signal amplitude. Level detectors are widely known and the details of level detection are not central to the invention.

Outputs of the level detectors 112, 122 are threshold detected by comparators 114, 124, respectively. Outputs of the comparators 114, 124 are connected to a decision system 170, which is used to control the state of the relays 130, 140, 150. In operation, if the primary signal degrades below an acceptable threshold, this is termed a signal fault, and the output of the comparator 114 changes states. If a signal fault occurs on the primary signal while the backup signal remains satisfactory, the decision system 170 then drives the relays 130, 140, and 150 to change states. The same detection may be made by the comparator 124 if the secondary input is the currently active input.

In circuit operation, if any of the relays 130, 140, 150 fails to make good electrical contact, the signal on the primary or backup input will not be connected to either the output relay 150 or the terminating resistors 134, 144. This condition is called being un-terminated. The un-terminated signal will have a different amplitude than one that is properly terminated. The un-terminated signal will also have a different amplitude vs. frequency profile. Typically the un-terminated signal will become approximately two times larger at low frequencies, and will generate standing waves that vary as a function of frequency. The switching relay circuit 100 of FIG. 1 cannot detect such problems.

FIG. 2 is a block circuit diagram of an improved relay failure detection system 200 according to embodiments of the invention that can detect relay faults in addition to detecting signal faults. Error condition detectors in the failure detection system 200 are better able ascertain problems on the primary and secondary inputs 210, 220 and problems with the relays than in the relay circuit 100 of FIG. 1. For brevity, like functions between the detection systems 100 and 200 are not repeated.

An output of a level detector 212 is coupled to a first comparator 214 having a low threshold input, and also coupled to a second comparator 216 having a high threshold input. Each of the threshold values may be user-definable or pre-set. In operation, the low threshold comparator 214 detects the low signal condition described above, i.e., a signal fault, on the primary input 210. The high threshold comparator 216, however, may be able to detect the condition when the primary input is un-terminated, based on the increased level of signals described above. Such a detection could be caused by a relay fault. If either of the outputs of the comparators 216, 226 switch states, a decision system 270 can detect such a change, determine that an error condition exists, and take subsequent action. The actions the decision system 270 takes are described in more detail below.

In these or other embodiments, the decision system 270 may additionally determine whether a relay fault occurred, after switching the relays, based on detecting the signal fault or other reasons for switching, such as a manual switching of inputs by a user.

In some embodiments, the decision system 270 is coupled to or includes a relay cycler 272. When the output from the comparators 216, 226 indicate that a relay fault has occurred, the relay cycler 272 causes the armature in one or more of the relays 230, 240, 250 to quickly cycle between states in an effort to mechanically remove any oxidation or organic material that may have appeared on the electrical contacts of the relay. For instance the relay may be cycled 2-40 times, and more preferably between 10 and 20 times within a short time period, such as one or two seconds. The particular number and time period of cycles may be chosen or modified depending on an operating environment or other factors. Because the relays 230, 240, 250 are mechanical relays, this rapid switching may sound like buzzing.

It is not strictly necessary that all of the relays 230, 240, 250 be cycled simultaneously. In other embodiments only one or two of the relays may be cycled at the same time. In other embodiments each of the relays could be cycled sequentially, although not preferred because of the additional time necessary to cycle through all of the relays. It is also not strictly necessary that three relays be present in the circuit 200. Relay 250 could be removed and the outputs from relays 230, 240 could simply be coupled together and the circuit still functions appropriately. Alternatively, in a single-relay embodiment, relays 230 and 240, along with resistors 234 and 244 can be removed from the failure detection system 200, and the signal inputs can be coupled directly to output relay 250. In this configuration the fault detection will still function, but without a termination on the unused input. Although embodiments of the invention work in many configurations, the preferred switching method of an ECO uses the three relays as illustrated in FIG. 2.

Figure 3:
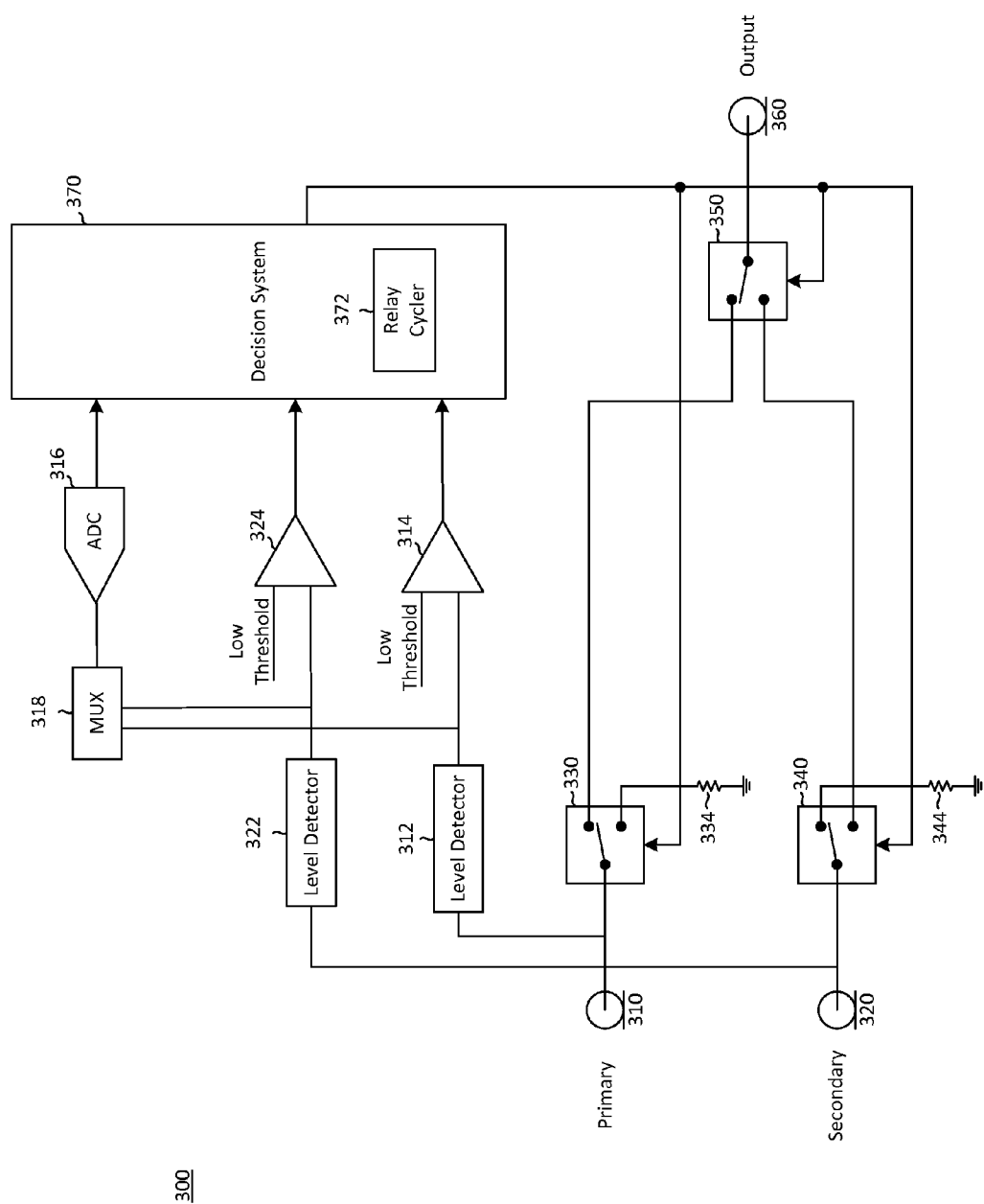
FIG. 3 is a block circuit diagram of another relay failure detection system according to embodiments of the invention.

FIG. 3 is a block circuit diagram of another improved relay failure detection system 300 according to embodiments of the invention. The failure detection system 300 is similar to the detection system 200 of FIG. 2, except that the high threshold comparators 216, 226 are not present. Instead, the failure detection system 300 includes an Analog to Digital Converter (ADC) 316 coupled to outputs of a level detector 312 and a level detector 322 through operation of a multiplexor (MUX) 318. The MUX 318 may be controlled to automatically cycle across all inputs to which it is coupled, and the ADC then converts those signals to numeric values indicative of the input signals.

In operation, for example, the level detected by the level detector 312 is compared to the low threshold by the low comparator 314, but is also converted to digital number by the ADC 316 and stored in a decision system 370 or elsewhere in the system 300. In operation, a determiner in the decision system 370 may compare the digitized level to a pre-defined threshold in software, or by using a computer process, and so determine that a relay fault error condition exists.

In another embodiment, a fault detector system such as the system 300 could, rather than detecting an absolute signal level, instead detect a change in amplitude of the signal level. For instance, the fault detector system 300 may first detect a level while the backup signal is internally terminated and store the level in the decision system 370 or elsewhere in the system 300. Then, the stored level may be later compared to a level after the ECO switches to make the backup signal be the active signal. If the two signal levels are significantly different, i.e., the level changed significantly after the ECO switched inputs, then it is likely that there is a problem with at least one of the relays in the system 300, and the decision system 370 may act accordingly.

In a particular embodiment, the ADC 316 is coupled to many sets of primary and secondary inputs, respectively, in an ECO by using a multi-input MUX instead of a two-input MUX such as the MUX 318.

In operation, the ADC 316 may generate signal level data, for example, in terms of voltage, for each input every second. Then the generated data are compared to individual thresholds for each generated voltage.

The decision systems 270 and 370 of FIGS. 2 and 3 may perform particular functions when they detect a relay error condition. As described above, the decision systems 270, 370 may include a relay cycling circuit 272, 372, structured to cause one or more relays in the ECO to cycle several times in quick succession. The decision systems 270, 370 may also generate a notice to an operator that the ECO had a relay error. For instance the notice may be made by generating an entry in an error log. Notice may also be given by causing an error light to illuminate or a sound to be generated. In other embodiments the decision systems 270, 370 may send an email message to a pre-determined address, or may send a text message to a particular phone number. Of course, other notices are possible. The decision systems 270, 370 may send error messages through multiple channels simultaneously or sequentially. The error messages may be sent in conjunction with cycling relays. In other embodiments cycling the relays may be triggered only by pressing a button or receiving other user action. In such an embodiment the decision systems 270, 370 may first send an error message to an operator who investigates and determines to cycle the relays by pressing such a cycle button.

Figure 4:
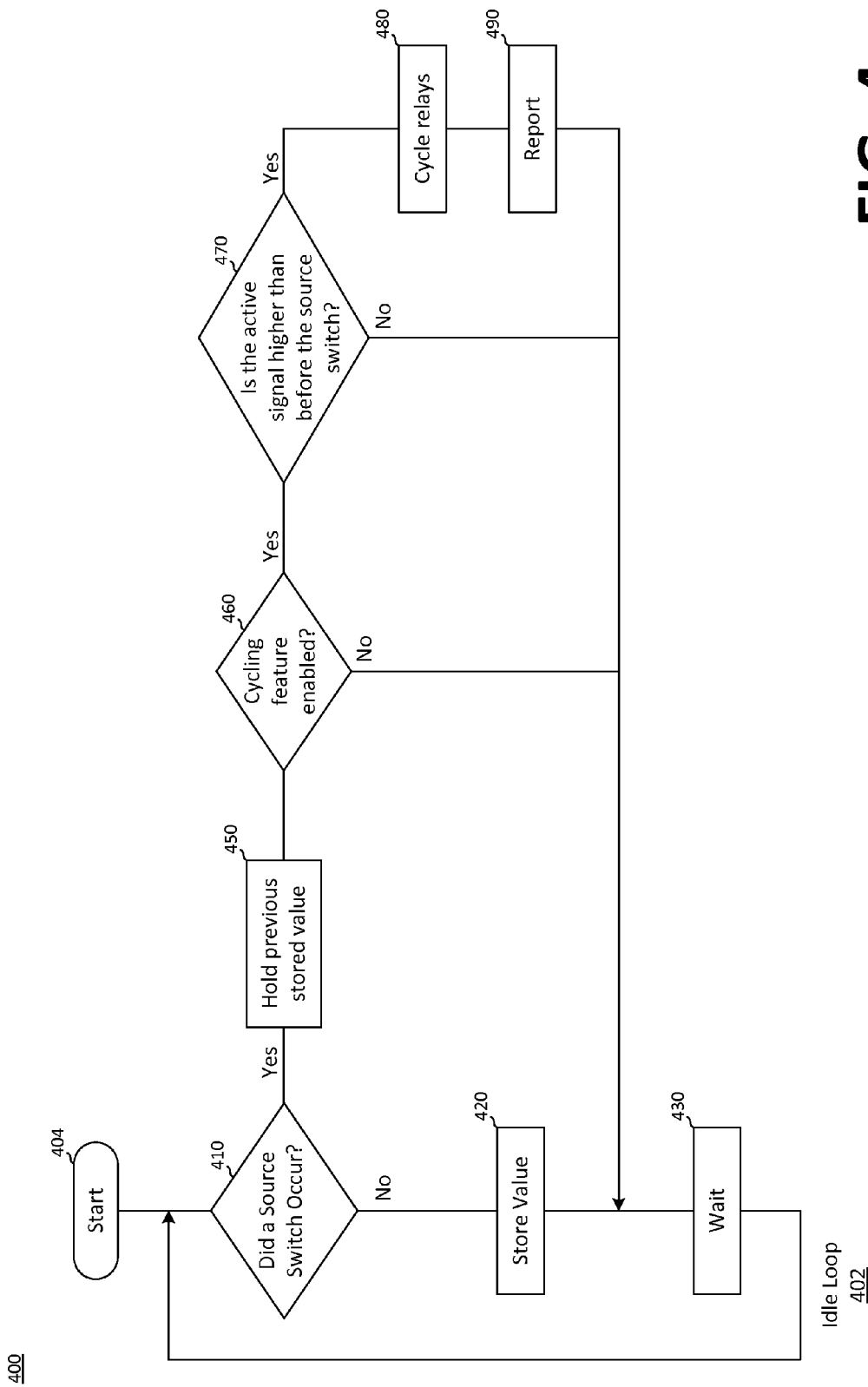
FIG. 4 is an example flow diagram illustrating operations used by embodiments of the invention.

One particular embodiment of the invention is described with reference to FIG. 4, which is an example flow diagram illustrating operations used by embodiments of the invention.

In the described embodiment, the system checks for a relay fault only after a signal source switch occurred. In one implementation the relay fault is only checked for within a period of time after a signal source switch, such as ten seconds. As described above, a signal source switch may occur due to a signal fault or due to a manual switching performed by a user.

A flow 400 begins at operation 410 when the system checks to see if a signal source switch occurred. In one embodiment the operation 410 may check to see if a signal source switch has occurred by checking a flag or other indicator that is set by the decision system 370 when a signal source switch occurs.

If no signal source switch occurred in the operation 410, the operation 420 stores a value of the inactive signal, i.e., whichever of the input signals is internally terminated, so that a constantly updated record of a normal operating level exists for later reference, if necessary. In particular, the operation 420 may store the digitized output from the ADC 316 of all of the inactive signals in the ECO.

After the value is stored in operation 420, the system waits for a time period, such as one to five seconds in an operation 430, and then checks again for a signal source switch on the same or on another channel within the ECO.

The operations 410, 420, and 430 make up a continuous loop called an idle loop 402. If no signal source switches occur, then the system operation stays in the idle loop 402.

If instead a signal source switch occurred, such an occurrence is detected in operation 410, and the flow 400 exits in the YES direction to an operation 450. Operation 450 copies and stores the particular stored value of the inactive signal from a time before the switch occurred. In other words, because the operation 420 is constantly storing signal values, the operation 450 is able to retrieve a value from before the switch occurred.

Then, provided the relay cycling feature is enabled, which is checked by an operation 460, an operation 470 compares a present signal value from the now-active signal to the previously in-active signal. If the current active signal is larger than the in-active primary signal, or in some embodiments larger than a threshold difference, then this indicates a fault with one or more relays may be present, i.e., a relay fault, as described above.

If there is a relay fault, then the system may cycle one or more of the relays in the particular ECO channel in an operation 480, as described above. This cycling may correct the relay problem.

A reporting operation 490 reports the relay fault. As described above, this may include generating an entry in an error log, a warning sound, or a warning light. The relay fault may also be reported by an automatic text or email message. In some embodiments the reporting operation 490 may precede the actual cycling of the relays in operation 480.

In various embodiments, components of the invention may be implemented in hardware, software, or a combination of the two, and may comprise a general purpose microprocessor, a digital signal processor (DSP), an application specific integrated circuit (ASIC), a field-programmable gate array (FPGA), or the like. For instance, the decision systems 270, 370 may be implemented in hardware or programmable hardware, such as an FPGA, while the threshold detection and other functions of the relay fault detection circuit may be implemented by software running on a specifically programmed microprocessor, such as an embedded microprocessor. In other embodiments the software may be running on a general purpose processor, either coupled to the detection system or operating on a separate computer coupled to an ECO.

Although specific embodiments of the invention have been illustrated and described for purposes if illustration, it will be understood that various modifications may be made without departing from the spirit and scope of the invention. Accordingly, the invention should not be limited except as by the appended claims.

What is claimed is:

1. A relay fault detection system structured to detect relay faults within a switching system, the relay fault detection system comprising:
   a first relay having an input structured to couple to a first signal, and having first and second outputs, the first output coupled to a termination resistor and the second output coupled to an output of the switching system, the first relay structured to couple the first signal to the first output or the second output of the first relay;
   a second relay having an input structured to couple to a second signal, and having first and second outputs, the second output coupled to a termination resistor and the first output coupled to the output of the switching system, the second relay structured to couple the second signal to the first output or the second output of the second relay;
   a control system structured to operate the first and second relays to make exactly one of the first or second signals an active signal on the output of the switching system;
   a first level detector coupled to the first signal and a second level detector coupled to the second signal, each of the first and second level detectors structured to generate a signal level output from the respective first signal and second signal;
   a first low threshold detector coupled to the first level detector and structured to detect a low signal level output of the first level detector as a signal fault when the first signal degrades below a low threshold value;
   a second low threshold detector coupled to the second level detector and structured to detect a low signal level output of the second level detector as a signal fault when the second signal degrades below the low threshold value;

a first high threshold detector coupled to the first level detector and structured to detect a high signal level output of the first level detector in the presence of a first relay fault when the first signal is higher than a high threshold value; and a second high threshold detector coupled to the second level detector and structured to detect a high signal level output of the second level detector in the presence of a second relay fault when the second signal is higher than the high threshold value.

2. The relay fault detection system according to claim 1, further comprising:

an output relay having a first input coupled to the second output of the first relay and having a second input coupled to the first output of the second relay, the output relay including an output that is also the output of the switching system.

3. The relay fault detection system according to claim 2, further comprising:

a cycle circuit structured to cause the control system to cycle either the first relay, the second relay, the output relay, or any two or three of the relays between a first operative state and a second operative state a plurality of times after the high threshold detector generates a relay fault.

4. The fault detection system according to claim 1, in which each of the first and second high threshold detectors is a comparator having a high threshold input and having an input coupled to the output of the respective first or second level detector.

5. The fault detection system according to claim 1, in which each of the first and second high threshold detectors comprises:

an Analog to Digital Converter (ADC) coupled to the output of the respective first or second level detector and structured to generate a digital representation of a signal level output by the respective first or second level detector; and a determiner structured to compare the output of the ADC the high threshold value.

6. The fault detection system according to claim 5, in which the determiner comprises a software process running on a processor.

7. The fault detection system according to claim 1, further comprising:

a notification unit structured to generate a notification based on a presence of a relay fault, the notification including one or more of an entry in an error log, a sound, a light, a text message, or an email.

8. The relay fault detection system according to claim 1, further comprising:

a cycle circuit structured to cause the control system to cycle either the first relay, the second relay, or the output relay, or any two or three of the relays between a first operative state and a second operative state a plurality of times after the first or second high threshold detector generates a relay fault; and a notification unit structured to generate a notification based on a presence of a relay fault, the notification including one or more of an entry in an error log, a sound, a light, a text message, or an email.

9. An electronic changeover unit having a set of first inputs and a set of related second inputs, the electronic changeover unit comprising:

a series of channels, in which each channel includes:

a first relay having an input structured to couple to a first signal, and having first and second outputs, the first output coupled to a termination resistor and the second output coupled to a channel output, the first relay structured to couple the first signal to the first output or the second output of the first relay, a second relay having an input structured to couple to a second signal, and having first and second outputs, the second output coupled to a termination resistor and the first output coupled to the channel output, the second relay structured to couple the second signal to the first output or the second output of the second relay, a control system structured to operate the first and second relays to make exactly one of the first or second signals an active signal of the channel output, a first level detector coupled to the first signal and a second level detector coupled to the second signal, each of the first and second level detectors structured to generate a signal level output from the respective first signal and second signal, a first low threshold detector coupled to the first level detector and structured to detect a low signal level output of the first level detector as a signal fault when the first signal degrades below a low threshold value, a second low threshold detector coupled to the second level detector and structured to detect a low signal level output of the second level detector as a signal fault when the second signal degrades below a low threshold value;

a first high threshold detector coupled to the first level detector and structured to detect a high signal level output of the first level detector in the presence of a first relay fault when the first signal is higher than a high threshold value; and a second high threshold detector coupled to the second level detector and structured to detect a high signal level output of the second level detector in the presence of a second relay fault when the second signal is higher than the high threshold value.

10. The electronic changeover unit according to claim 9, further comprising:

an output relay having a first input coupled to the second output of the first relay and having a second input coupled to the first output of the second relay, the output relay including an output that is also the output of the channel.

11. The electronic changeover unit according to claim 10, further comprising:

a cycle circuit structured to cause the control system to cycle either the first relay, the second relay, or the output relay, or any two or three of the relays between a first operative state and a second operative state a plurality of times after the first or second high threshold detector generates a relay fault.

12. The electronic changeover unit according to claim 10, further comprising:

a cycle circuit structured to cause the control system to cycle either the first relay, the second relay, or the output relay, or any two or three of the relays between a first operative state and a second operative state a plurality of times after the first or second high threshold detector generates a relay fault; and a notification unit structured to generate a notification based on a presence of a relay fault, the notification including one or more of an entry in an error log, a sound, a light, a text message, or an email.

13. The electronic changeover unit according to claim 9, in which each of the first and second high threshold detectors comprises:
an Analog to Digital Converter (ADC) coupled to the output of the respective first or second level detector and structured to generate a digital representation of a signal level output by the respective first or second level detector.

14. The electronic changeover unit according to claim 13, in which the control system comprises storage registers structured to store values generated by the ADC.

15. The electronic changeover unit according to claim 9, further comprising:
a notification unit structured to generate a notification based on a presence of a relay fault, the notification including one or more of an entry in an error log, a sound, a light, a text message, or an email.

16. A relay fault detection system structured to detect relay faults within a switching system, the relay fault detection system comprising:
a primary signal receiver for receiving a primary signal and a backup signal receiver for receiving a backup signal;
one or more relays coupled between the primary signal receiver, the backup signal receiver, and an output of the switching system;
a control system structured to drive the one or more relays to cause one of the primary signal and the backup signal to be an active signal on the output of the switching system,
a first level detector coupled to the primary signal and a second level detector coupled to the backup signal, each of the first and second level detectors structured to generate a signal level output from the primary signal and from the backup signal;
a first low threshold detector coupled to the first level detector and structured to detect a low signal level output from the first level detector as a signal fault when the primary signal degrades below the low threshold value;
a second low threshold detector coupled to the second level detector and structured to detect a low signal level output of the second level detector as a signal fault when the backup signal degrades below the low threshold value;
a first high threshold detector coupled to the first level detector and structured to detect a high signal level output of the first level detector in the presence of a first relay fault when the primary signal is higher than a high threshold value; and
a second high threshold detector coupled to the second level detector and structured to detect a high signal level output from the level detector in the presences of a second relay fault when the backup signal is higher than the high threshold value.

17. The relay fault detection system according to claim 16, in which the one or more relays comprises:
a first relay having an input coupled to the primary signal receiver, and having first and second outputs, the first output coupled to a termination resistor and the second output coupled to the output of the switching system, the first relay structured to couple the primary signal to the first output or the second output; and
a second relay having an input coupled to the backup signal receiver, and having first and second outputs, the second output coupled to a termination resistor and the first output coupled to the output of the switching system, the second relay structured to couple the second signal to the first output or the second output.

18. The relay fault detection system according to claim 16, in which the one or more relays further comprises:
an output relay having a first input coupled to the second output of the first relay and having a second input coupled to the first output of the second relay, the output relay including an output that is also the output of the switching system.

19. A method of operating an electronic changeover unit including a first relay coupled to a first signal input, a second relay coupled to a second signal input, and an output relay coupled to the first relay and the second relay, and in which one of the first signal input or the second signal input is an active signal of the electronic changeover unit, the method comprising:
detecting that the electronic changeover unit switched which of the first signal input or the second signal input is the active signal;
comparing a signal level from the previously in-active signal to a signal level from the presently active signal;
determining, based on the comparison, that a relay fault has occurred; and
cycling states of at least one of the first relay, second relay, or output relay when the relay fault has occurred.

20. The method operating an electronic changeover unit according to claim in which cycling states of at least one of the first relay, second relay, or output relay comprises changing states successively a plurality of times.

21. The method operating an electronic changeover unit according to claim 19, further comprising:
generating a digital value of the previously in-active signal;
generating a digital value of the presently active signal;
and in which comparing a signal level from the previously in-active signal to a signal level from the presently active signal comprises comparing the digital values.

22. The method operating an electronic changeover unit according to claim 19, further comprising:
generating a notification based on a state of the relay fault occurring, the notification including one or more of an entry in an error log, a sound, a light, a text message, or an email.

23. The method operating an electronic changeover unit according to claim 19 in which cycling states of at least one of the first relay, second relay, or output relay only occurs if the individual relays have been enabled to be cycled.

* * * * *

UNITED STATES PATENT AND TRADEMARK OFFICE
CERTIFICATE OF CORRECTION

PATENT NO. : 9,236,209 B2
APPLICATION NO. : 14/242673
DATED : January 12, 2016
INVENTOR(S) : Michael S. Overton et al.

It is certified that error appears in the above-identified patent and that said Letters Patent is hereby corrected as shown below:

In The Claims

In column 10, line 36, replace "claim in which" with -- claim 19 in which --.

Signed and Sealed this
First Day of March, 2016

Michelle K. Lee
*Director of the United States Patent and Trademark Office*